(12) United States Patent
Ahirwar et al.

(10) Patent No.: US 9,319,179 B1
(45) Date of Patent: Apr. 19, 2016

(54) METHODS AND APPARATUS FOR GENERATING EXPANDED CODE WORDS TO SUPPORT ERROR CORRECTION IN A DATA COMMUNICATION SYSTEM

(71) Applicant: Marvell International Ltd., Hamilton (BM)

(72) Inventors: Vijay Ahirwar, Bhopal (IN); Ankit Sethi, Pune (IN); Swaroop Venkatesh, Dubllin, CA (US); Josselin de la Broise, Mountain View, CA (US)

(73) Assignee: Marvell International Ltd., Hamilton (BM)

( * ) Notice: Subject to any disclaimer, the term of this patent is extended or adjusted under 35 U.S.C. 154(b) by 9 days.

(21) Appl. No.: 14/247,685

(22) Filed: Apr. 8, 2014

Related U.S. Application Data

(60) Provisional application No. 61/809,985, filed on Apr. 9, 2013.

(51) Int. Cl.
*H04L 1/00* (2006.01)
*H04L 1/18* (2006.01)
*H03M 13/15* (2006.01)
*H04L 1/06* (2006.01)
*H04L 25/03* (2006.01)
*G06F 11/10* (2006.01)
*H03M 13/29* (2006.01)

(52) U.S. Cl.
CPC .............. *H04L 1/0041* (2013.01); *G06F 11/10* (2013.01); *H03M 13/152* (2013.01); *H03M 13/29* (2013.01); *H04L 1/00* (2013.01); *H04L 1/0045* (2013.01); *H04L 1/0057* (2013.01); *H04L 1/0061* (2013.01); *H04L 1/0625* (2013.01); *H04L 1/1845* (2013.01); *H04L 2025/03426* (2013.01)

(58) Field of Classification Search
CPC ... H04L 1/0041; H04L 1/0057; H04L 1/0045; H04L 1/0625; H04L 1/1845; H04L 2025/03426; H04L 1/00; H04L 1/0061; G06F 11/10; H03M 13/2906; H03M 13/152; H03M 13/29
USPC ............. 714/755, 776, 782; 375/240.27, 295, 375/316
See application file for complete search history.

(56) References Cited

U.S. PATENT DOCUMENTS

| | | | | |
|---|---|---|---|---|
| 5,636,208 A | * | 6/1997 | Chang | ................... H04L 1/0057 370/347 |
| 6,543,022 B1 | * | 4/2003 | O'Connor | ............. H03M 13/03 380/46 |

(Continued)

*Primary Examiner* — April Y Blair
*Assistant Examiner* — Sazzad Hossain (57) ABSTRACT

The present disclosure describes methods and apparatus for generating expanded code words to support error correction in a data communication system. In some aspects data to be encoded and a first subset of bits of a first bit sequence are obtained. A first combined bit sequence is generated by combining the data and the first subset of bits. A first code word is generated by applying an error correcting code to the first combined bit sequence. The first code word is combined with the first bit sequence, resulting in first encoded data that includes both first parity information and the data. The generating, applying, and combining are repeated with a second subset of bits of a second bit sequence, resulting in second encoded data that includes both second parity information and the data, the second encoded data being based on a second code word rather than the first code word.

20 Claims, 10 Drawing Sheets

(56) References Cited

U.S. PATENT DOCUMENTS

| | | | | |
|---|---|---|---|---|
| 6,678,854 B1* | 1/2004 | Irvin | ................... | H03M 13/05 370/333 |
| 2002/0012337 A1* | 1/2002 | Schmidl | ................ | H04L 1/0026 370/349 |
| 2008/0040651 A1* | 2/2008 | Kanaoka | ........... | H03M 13/1102 714/794 |
| 2011/0286267 A1* | 11/2011 | Rychlik | ................. | G11C 16/10 365/185.03 |
| 2012/0300873 A1* | 11/2012 | Graumann | ........ | H03M 13/1148 375/295 |
| 2014/0229786 A1* | 8/2014 | Poolakkaparambil | ..................... | G06F 11/1048 714/746 |

\* cited by examiner

METHODS AND APPARATUS FOR GENERATING EXPANDED CODE WORDS TO SUPPORT ERROR CORRECTION IN A DATA COMMUNICATION SYSTEM

CROSS-REFERENCE TO RELATED APPLICATION

This present disclosure claims priority to U.S. Provisional Patent Application Ser. No. 61/809,985 filed Apr. 9, 2013, the disclosure of which is incorporated herein by reference in its entirety.

BACKGROUND

As the number and types of computing and other electronic devices that are available has increased, it has become increasingly important for devices to be able to communicate with one another. This communication typically involves sending (or transmitting) data from one device to another, but problems exist with sending such data because errors can be introduced during the transmission process. Some techniques have been developed to reduce the errors or correct errors that are introduced, but such problems remain and are only exacerbated as the number of devices increases, resulting in increased interference by the devices with one another. This can lead to frustration for the users of these devices and poor user experiences with these devices.

SUMMARY

This summary is provided to introduce subject matter that is further described below in the Detailed Description and Drawings. Accordingly, this Summary should not be considered to describe essential features nor used to limit the scope of the claimed subject matter.

In general, in one aspect, this specification describes a method that includes obtaining data to be encoded and obtaining a first subset of bits of a first bit sequence. The method also includes combining the data and the first subset of bits to generate a first combined bit sequence, applying an error correcting code to the first combined bit sequence to generate a first code word having a greater length than the first combined bit sequence, and combining the first code word with the first bit sequence, resulting in first encoded data that includes both first parity information and the data. The method further includes repeating the applying and each combining with a second subset of bits of a second bit sequence resulting in second encoded data that includes both second parity information and the data, the second encoded data being based on a second code word generated by the error correcting code rather than the first code word.

In general, in another aspect, this specification describes a device that includes an expanded code word data encoder and a transmitter. The expanded code word data encoder is configured to obtain data to be encoded and obtain a first subset of bits of a first bit sequence. The expanded code word data encoder is further configured to combine the data and the first subset of bits to generate a first combined bit sequence, apply an error correcting code to the first combined bit sequence to generate a first code word having a greater length than the first combined bit sequence, and combine the first code word with the first bit sequence, resulting in first encoded data that includes both first parity information and the data. The expanded code word data encoder is further configured to repeat the applying and each combining with a second subset of bits of a second bit sequence resulting in second encoded data that includes both second parity information and the data, the second encoded data being based on a second code word generated by the error correcting code rather than the first code word. The transmitter is configured to transmit the first encoded data and the second encoded data to one or more target devices.

In general, in another aspect, this specification describes a computer-readable memory device comprising computer-executable instructions that, when executed, implement a system to obtain data to be encoded and obtain a first subset of bits of a first bit sequence. The system is also to combine the data and the first subset of bits to generate a first combined bit sequence, apply an error correcting code to the first combined bit sequence to generate a first code word having a greater length than the first combined bit sequence, and combine the first code word with the first bit sequence, resulting in first encoded data that includes both first parity information and the data. The system is also to repeat the applying and each combining with a second subset of bits of a second bit sequence resulting in second encoded data that includes both second parity information and the data, the second encoded data being based on a second code word generated by the error correcting code rather than the first code word.

The details of one or more implementations are set forth in the accompanying drawings and the description below. Other features and advantages will be apparent from the description and drawings.

BRIEF DESCRIPTION OF THE DRAWINGS

In the figures, the left-most digit of a reference number identifies the figure in which the reference number first appears. The use of the same reference numbers in different instances in the description and the figures indicate like elements.

DETAILED DESCRIPTION

Methods and apparatus for generating expanded code words to support error correction in a data communication system are discussed herein. Generally, data to be encoded is obtained and combined with a subset of bits of a first bit sequence to generate a first combined bit sequence. An error correcting code is applied to the first combined bit sequence to generate a first code word having a greater length (number of bits) than the combined bit sequence. The first code word is combined with the first bit sequence, resulting in first encoded data that includes both a first set of parity information that has been combined with the first bit sequence, and the originally obtained data. The process is then repeated with a second bit sequence that may be derived from the first bit sequence, resulting in a second code word and thus second encoded data. The amount of code words that are generated is thus expanded (e.g., doubled in number), although the size (number of bits) of the encoded data has remained the same.

Figure 1:
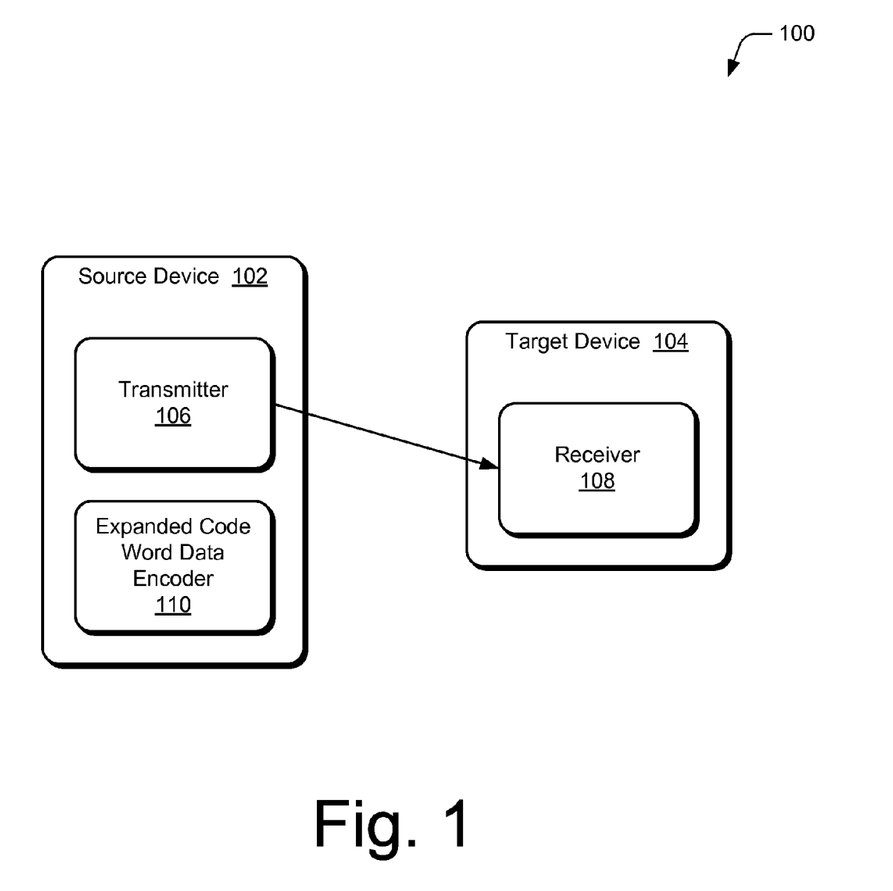
FIG. 1 illustrates an example system in which the methods and apparatus for generating expanded code words to support error correction in a data communication system can be used in accordance with one or more embodiments.

FIG. 1 illustrates an example system 100 in which the methods and apparatus for generating expanded code words to support error correction in a data communication system can be used in accordance with one or more embodiments. The system 100 includes a source device 102 and a target device 104. The source device 102 includes a transmitter 106 that transmits data to the target device 104, which includes a receiver 108 that receives the data. The transmitter 106 can transmit data to the receiver 108 using wired or wireless communication mechanisms. Various different data can be transmitted from the source device 102 to the target device 104 depending on the type of or functionality provided by the source device 102, the type of or functionality provided by the target device 104, the desires of a user of the source device 102, the desires of a user of the target device 104, and so forth. Similarly, data received by the target device 104 can be used in various different manners depending on the type of or functionality provided by the source device 102, the type of or functionality provided by the target device 104, the desires of a user of the source device 102, the desires of a user of the target device 104, and so forth.

The source device 102 includes an expanded code word data encoder 110. At least some of the data that is transmitted to the target device 104 is encoded by the expanded code word data encoder 110. The expanded code word data encoder 110 implements the techniques discussed herein to generate expanded code words to support error correction, as discussed in more detail below.

The target device 104 can also optionally transmit data to the source device 102. In such situations, the target device 104 includes a transmitter and the source device 102 includes a receiver. Alternatively, the transmitter 106 can be implemented as a transceiver that includes both transmitter and receiver functionality, and the receiver 108 can be implemented as a transceiver that includes both transmitter and receiver functionality.

Figure 2:
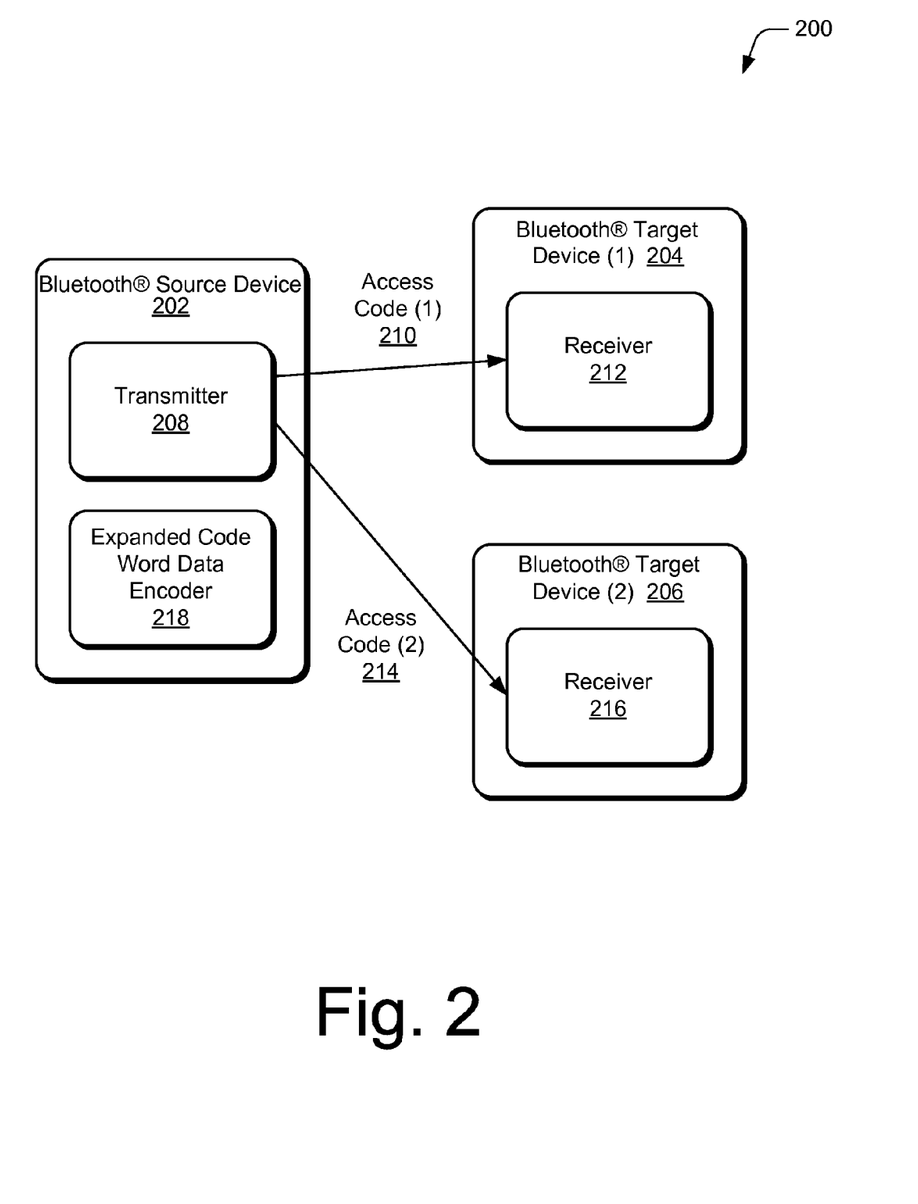
FIG. 2 illustrates another example system in which the methods and apparatus for generating expanded code words to support error correction in a data communication system can be used in accordance with one or more embodiments.

FIG. 2 illustrates another example system 200 in which the methods and apparatus for generating expanded code words to support error correction in a data communication system can be used in accordance with one or more embodiments. The system 200 is an example of a system 100 of FIG. 1, with the source device 102 of FIG. 1 being a Bluetooth® source device 202 of FIG. 2, and multiple target devices 104 of FIG. 1 being a Bluetooth® target device 204 and Bluetooth® target device 206 of FIG. 2. The Bluetooth® source device 202 and the Bluetooth® target devices 204 and 206 support communication between one another using standard Bluetooth® technology techniques.

Some of the data transmitted from the Bluetooth® source device 202 to the Bluetooth® target device 204 or 206 includes an access code, which can be used for various synchronization operations, to identify the Bluetooth® source device 202, and so forth. The Bluetooth® source device 202 includes a transmitter 208 that transmits an access code 210, which is received by the receiver 212 of the Bluetooth® target device 204. Similarly, the transmitter 208 transmits an access code 214, which is received by the receiver 216 of the Bluetooth® target device 204.

The format of the access code is a preamble (e.g., a 4-bit sequence), followed by a synchronization word (e.g., a 64-bit sequence), followed by a trailer (e.g., a 4-bit sequence). The Bluetooth® source device 202 includes an expanded code word data encoder 218, and for each access code 210 and 214 the synchronization word included in the access code 210 or 214 is encoded by the expanded code word data encoder 218. The expanded code word data encoder 218 implements the techniques discussed herein to generate expanded code words to support error correction, as discussed in more detail below.

Figure 3:
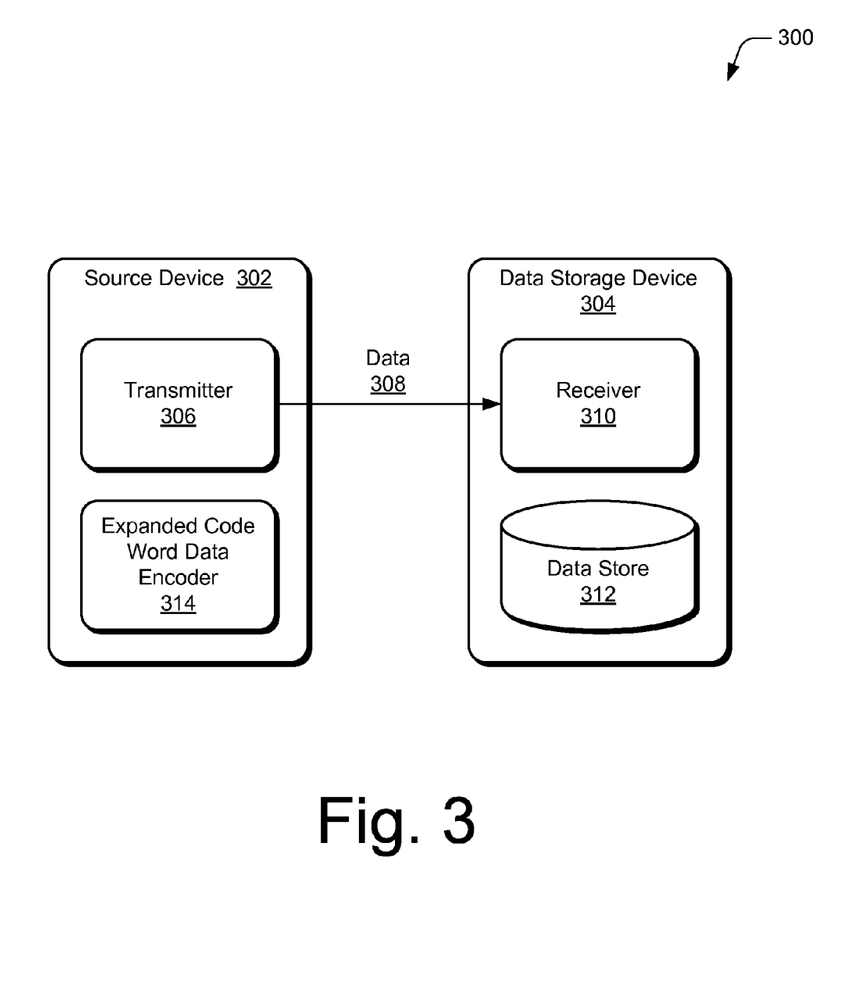
FIG. 3 illustrates another example system in which the methods and apparatus for generating expanded code words to support error correction in a data communication system can be used in accordance with one or more embodiments.

FIG. 3 illustrates another example system 300 in which the methods and apparatus for generating expanded code words to support error correction in a data communication system can be used in accordance with one or more embodiments. The system 300 is an example of a system 100 of FIG. 1, with the source device 102 of FIG. 1 being a source device 302 of FIG. 3, and the target device 104 of FIG. 1 being a data storage device 304. The source device 302 can include, for example, a storage controller that manages data read and write requests to the storage device 304, which can be internal or external to the storage device 302.

The source device 302 includes a transmitter 306 that transmits data 308, which is received by the receiver 310 of the data storage device 304. The data storage device 304 stores the received data 308 in a data store 312. The data store can be implemented using any of a variety of storage technologies, such as flash memory, magnetic disks, optical discs, combinations thereof, and so forth. The source device 302 includes an expanded code word data encoder 314 that implements the techniques discussed herein to generate data 308 based on expanded code words to support error correction, as discussed in more detail below.

Generally, the methods and apparatus for generating expanded code words to support error correction in a data communication system techniques discussed herein obtain data to be encoded and combine the data with a first subset of bits of a first bit sequence to generate a first combined bit sequence. An error correcting code is applied to the first combined bit sequence to generate a first code word having a greater length (number of bits) than the combined bit sequence. The first code word is combined with the first bit sequence, resulting in first encoded data that includes both a first set of parity information that has been combined with the first bit sequence, and the originally obtained data. The process is then repeated with a second bit sequence, which results in a second code word and thus second encoded data. The number of code words that is generated is thus increased (doubled), although the size (number of bits) of the encoded data has remained the same.

Figure 4A:
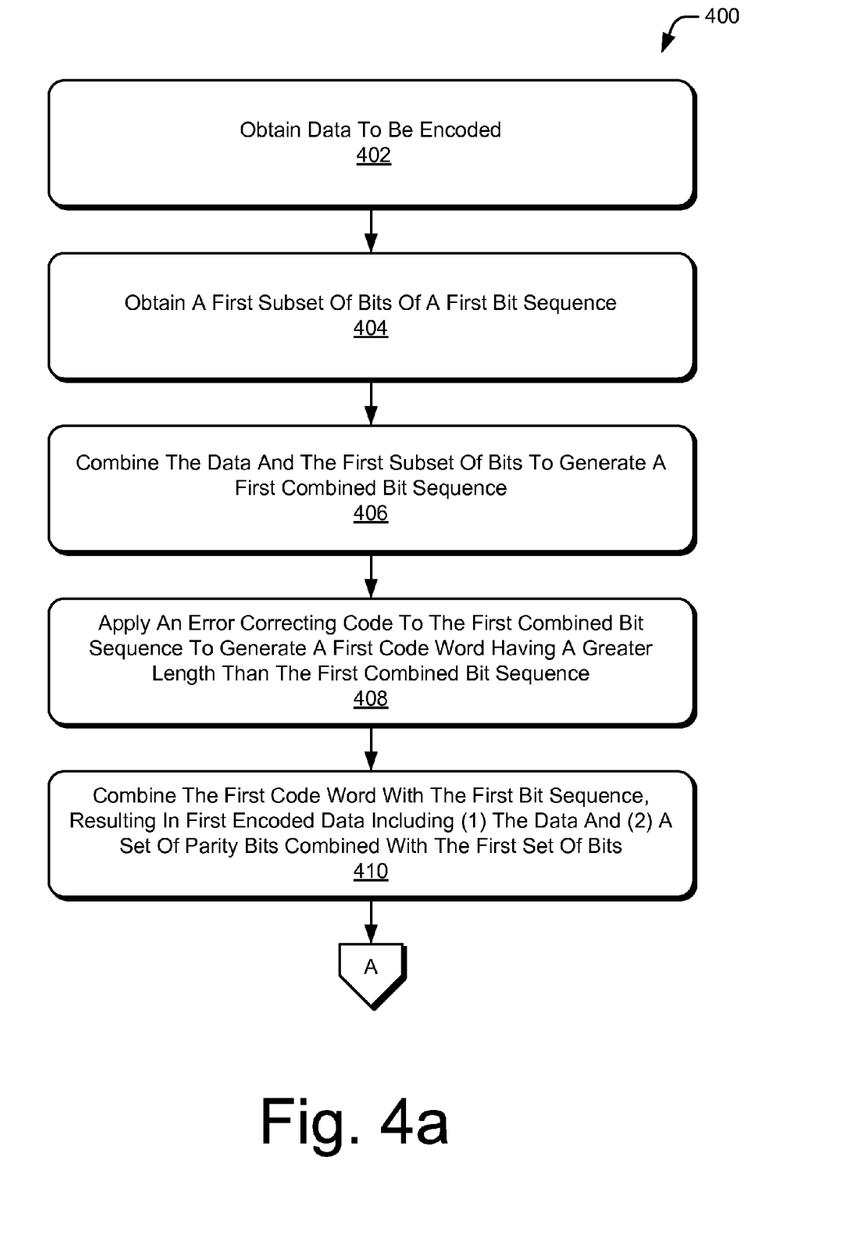
FIGS. 4a and 4b are a flowchart illustrating an example process for generating expanded code words to support error correction in a data communication system in accordance with one or more embodiments.
Figure 4B:
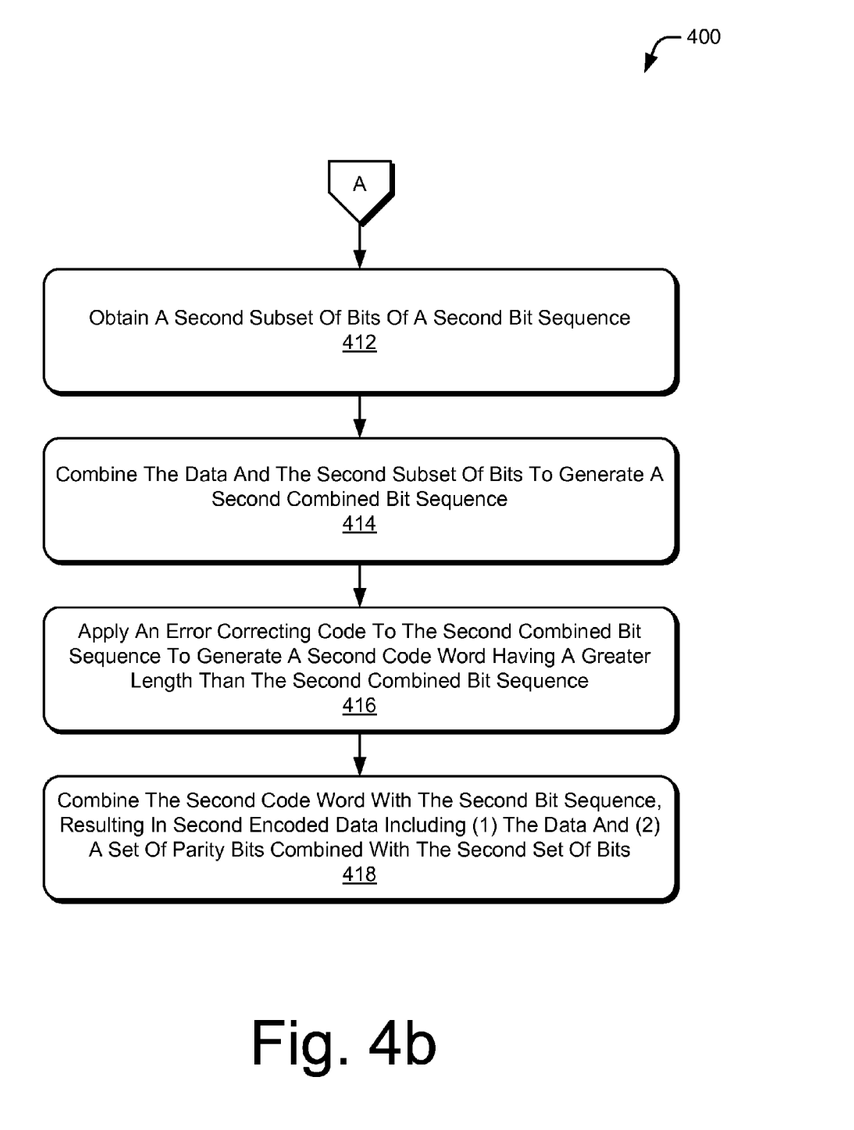

FIGS. 4a and 4b are a flowchart illustrating an example process 400 for generating expanded code words to support error correction in a data communication system in accordance with one or more embodiments. Process 400 is described in the form of a set of blocks that specify operations to be performed, however the operations are not necessarily limited to the order shown. The operations performed by the set of blocks in process 400 are performed by an expanded code word data encoder, such as the expanded code word data encoder 110 of FIG. 1, the expanded code word data encoder 218 of FIG. 2, or the expanded code word data encoder 314 of FIG. 3.

Figure 5:
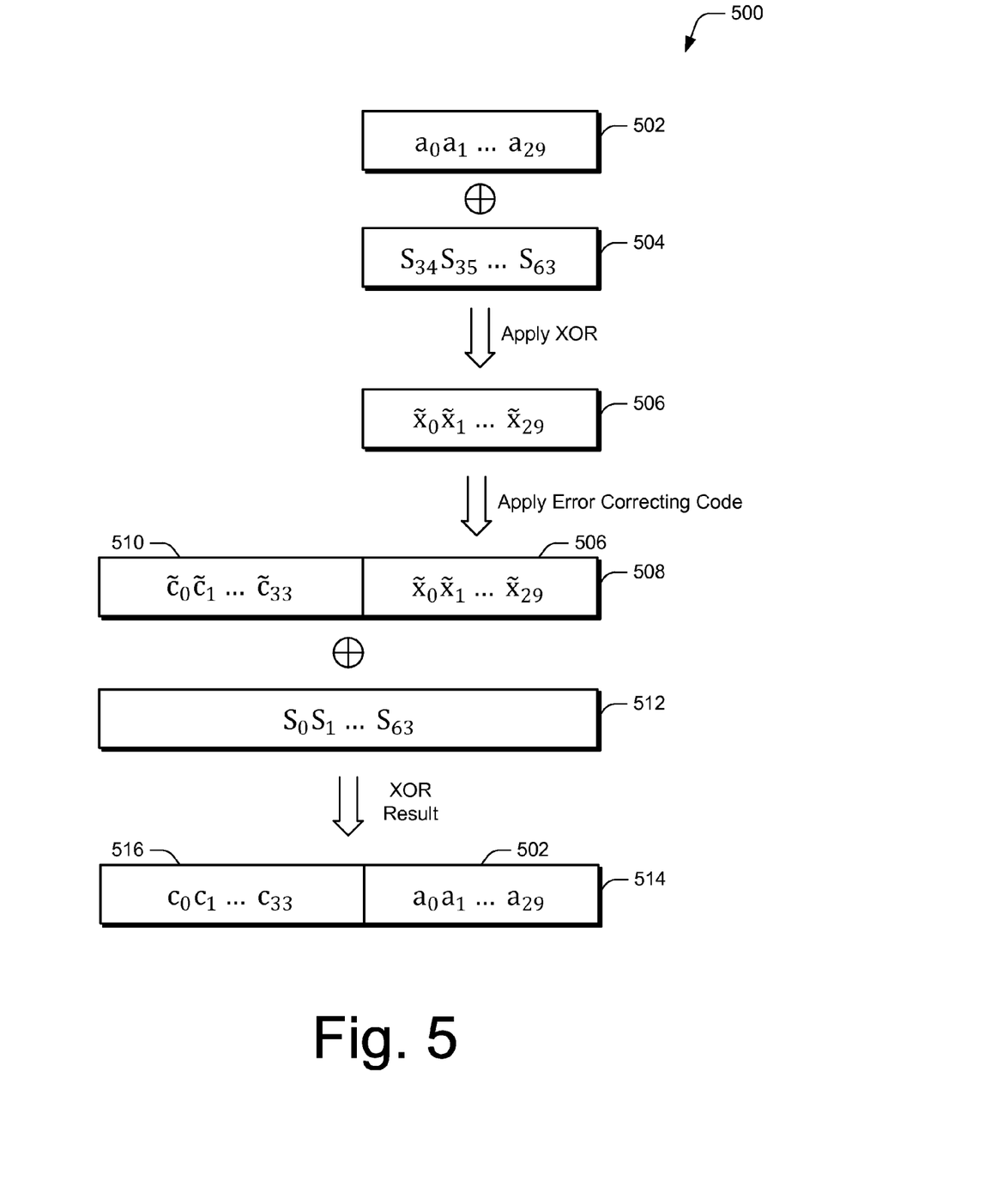
FIG. 5 illustrates an example of implementing the methods and apparatus for generating expanded code words to support error correction in a data communication system in accordance with one or more embodiments.
Figure 6:
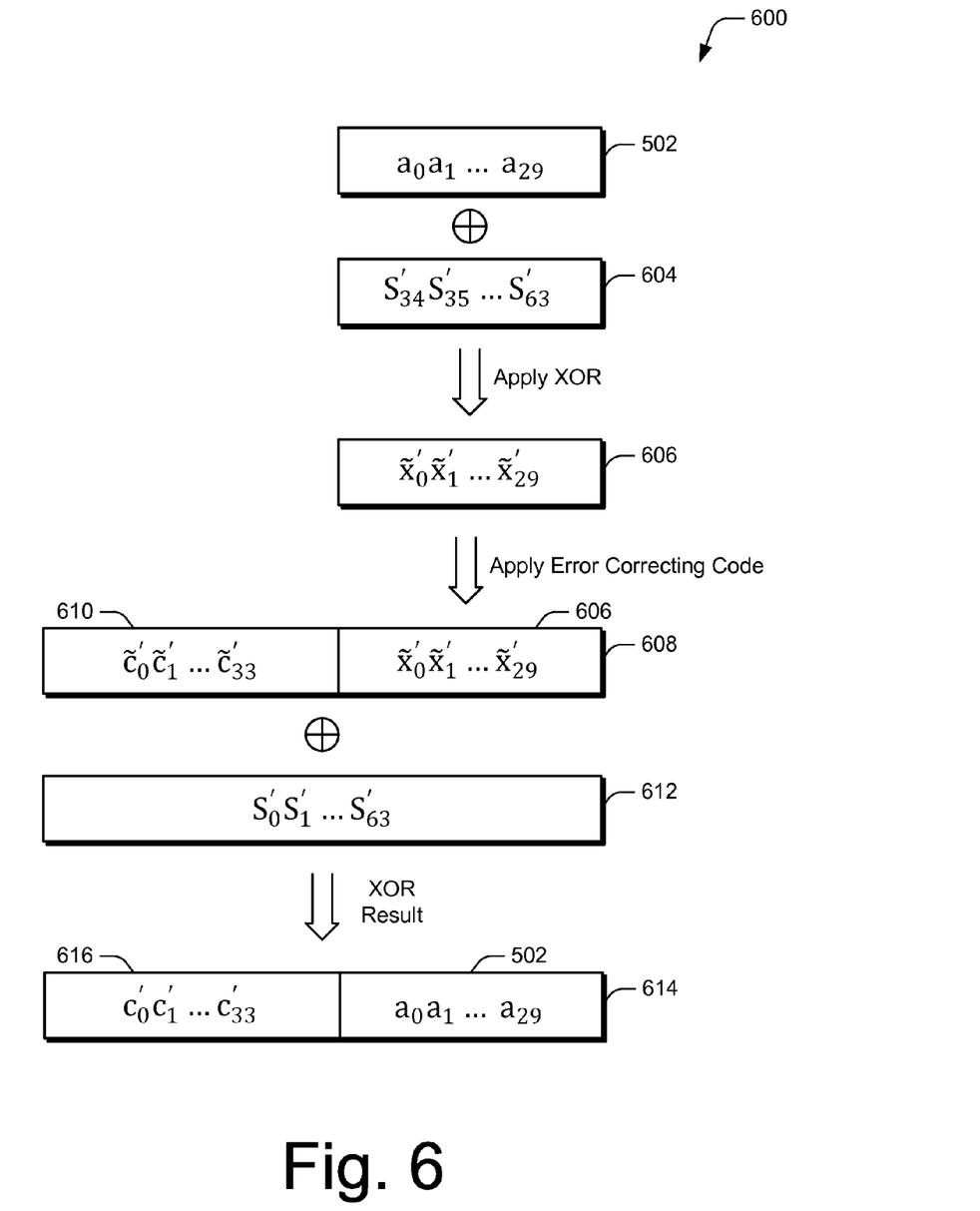
FIG. 6 illustrates an example of implementing the methods and apparatus for generating expanded code words to support error correction in a data communication system in accordance with one or more embodiments.

FIG. 5 illustrates an example 500 of implementing the methods and apparatus for generating expanded code words to support error correction in a data communication system in accordance with one or more embodiments. FIG. 6 illustrates another example 600 of implementing the methods and apparatus for generating expanded code words to support error correction in a data communication system in accordance with one or more embodiments. The examples 500 and 600 each identify various values as different sequences of bits. The process 400 of FIGS. 4a and 4b is discussed with reference to the example 500 of FIG. 5 as well as to the example 600 of FIG. 6.

At block 402, data to be encoded is obtained. The data can be obtained in any of a variety of different manners, such as passed to the expanded code word data encoder as a parameter, read from a file or memory location by the expanded code word data encoder, generated by the expanded code word data encoder itself, and so forth. In the example 500, the obtained data is illustrated as data 502, which is a 30-bit sequence ($a_0 a_1 \ldots a_{29}$).

In one or more embodiments, the obtained data is at least part of a Bluetooth® address of the source device, such as a 24-bit Lower Address Part (LAP), and a 6-bit Barker sequence (which is 110010 or 001101). The Bluetooth® address of the source device and the 6-bit Barker sequence are included as part of a Bluetooth® synchronization word that is communicated to a target device. The process 400 is performed each time a Bluetooth® synchronization word is to be transmitted to a target device. Alternatively, the process 400 can be performed once when a Bluetooth® synchronization word is to be transmitted to a target device, and the encoded data obtained by the process 400 maintained for subsequent transmissions to the target device.

At block 404, a first subset of bits of a first bit sequence is obtained. The expanded code word data encoder obtains the first bit sequence by generating the first bit sequence, or alternatively obtains the first sequence of bits from another component or module. In one or more embodiments, the first bit sequence is a randomly generated or pseudo-randomly generated sequence of bits. Alternatively, the first sequence of bits is generated or obtained according to various other rules or criteria.

The first subset of bits is a number of bits equal to the number of bits in the obtained data. In one or more embodiments, the first subset of bits is the higher bits of the first bit sequence, although alternatively the first subset of bits is the lower (or other selected) bits of the first bit sequence. In the example 500, a first sequence of bits is $S_0 S_1 \ldots S_{63}$, and the first subset of bits is subset 504, which is a 30-bit sequence of the higher bits of the first bit sequence. Thus, the subset 504 is the 30-bit sequence $S_{34} S_{35} \ldots S_{63}$.

At block 406, the data obtained at block 402 and the first subset of bits obtained at block 404 are combined to generate a first combined bit sequence. In one or more embodiments, the data and the first subset of bits are combined by applying an exclusive OR operation to the data and the first subset of bits. Alternatively, the data and the first subset of bits can be combined in different manners by applying different operations to the data and the first subset of bits. In the example 500, a first combined bit sequence 506 is illustrated as the 30-bit sequence $\tilde{x}\_0 \tilde{x}\_1 \ldots \tilde{x}\_29$.

At block 408, a systematic error correcting code is applied to the first combined bit sequence to generate a first code word. The first code word has a length (number of bits) greater than the first combined bit sequence generated at block 406. The first code word includes both parity information (a set of parity bits) and the first combined bit sequence generated at block 406. In the example 500, the first code word 508 is illustrated as the combination of a set of parity bits 510 and the first combined bit sequence 506. The first code word 508 is the 64-bit sequence of $\tilde{c}_0 \tilde{c}_1 \ldots \tilde{c}_{33}$ (the parity bits) followed by $\tilde{x}_0 \tilde{x}_1 \ldots \tilde{x}_{29}$ (the first combined bit sequence). Alternatively, in some implementations a non-systematic error correcting code is applied to generate a first code word 508 that is a 64-bit sequence with $\tilde{c}_0 \tilde{c}_1 \ldots \tilde{c}_{33}$ (the parity bits) followed by $\tilde{x}_0^+ \tilde{x}_1^+ \ldots \tilde{x}_9^+$ (which is not the first combined bit sequence).

In one or more embodiments, the error correcting code is a BCH error correcting code although alternatively other error correcting codes can be used. The error correcting code generates an output set of code words that, given a particular number of input bits, have a particular minimum distance from one another. This distance is referred to as the Hamming distance, which is the number of positions in any two code words that have different values. For example, in a bit sequence 0010 and a bit sequence 0011 the values at only one corresponding position vary (the third bit), so the Hamming distance between bit sequence 0010 and bit sequence 0011 is one. By way of another example, in a bit sequence 1111 and a bit sequence 0000 the values at all four corresponding positions vary, so the Hamming distance between bit sequence 1111 and bit sequence 0000 is four.

Generally, the larger the Hamming distance, the more errors in bit values of a code word that can be corrected automatically. For example, when transmitting data from a source device to a target device, some of the values of the data may not be received accurately due to interference. For example, in data that is 64 bits, a couple bit values may not be received correctly. The use of the error correcting code, however, allows the 30 bits of data to be transmitted as a 64-bit code word, and allows such incorrect bit values to be identified and corrected by the target device.

At block 410, the first code word generated at block 408 is combined with the first bit sequence obtained at block 404 to generate first encoded data. In one or more embodiments, the first code word and the first bit sequence are combined by applying an exclusive OR operation to first code word and the first bit sequence. Alternatively, the first code word and the first bit sequence can be combined in different manners by applying different operations to the first code word and the first bit sequence. The first encoded data includes parity information (a set of parity bits—the parity bits from the code word, modified based on the combination with the first bit sequence), and the originally obtained data (the data obtained at block 402) in the embodiment where a systematic error correcting code is applied. For other embodiments with non-systematic error correcting code, the first encoded data may not be the same as the obtained data to be encoded at block 402.

In the example 500, the exclusive OR operation is applied to the first code word 508 and the first bit sequence 512, resulting in the first encoded data 514. The first encoded data 514 is illustrated as the combination of a set of parity bits 516 and the data 502. The first code word 508 is the 64-bit sequence of $c\_0 \, c\_1 \ldots c\_33$ (the parity bits combined with the first bit sequence) followed by $a\_0 \, a\_1 \ldots a\_29$ (the data).

The obtained data at block 402 can be transmitted to a target device as the first encoded data. The 64-bit sequence that is the first encoded data includes both parity information (the parity bits generated by the error correcting code combined with the first bit sequence) and the data obtained at block 402. The target device can use the parity information to identify and correct incorrect bit values in the obtained data using any of a variety of public and/or proprietary techniques.

In one or more embodiments, the obtained data is a 30-bit value that is the Bluetooth® address of the source device and the 6-bit Barker sequence as discussed above. In such embodiments, the first encoded data is a 64-bit Bluetooth® synchronization word that is included in an access code transmitted to a target device.

At block 412, a second subset of bits of a second bit sequence is obtained. The expanded code word data encoder obtains the second bit sequence by generating the second bit sequence, or alternatively obtains the second sequence of bits from another component or module. In one or more embodiments, the second bit sequence is generated based on or derived from the first bit sequence obtained at block 404. For example, the second bit sequence is generated so that the second subset of bits obtained at block 414 includes the same value(s) as the first subset of bits obtained at block 404 for a particular number (e.g., referred to as m) of the lower (or alternatively higher) bits of the second subset of bits, and the remaining higher (e.g., 30-$m$) bits of the second subset of bits obtained at block 414 includes value(s) that are the complements of the corresponding remaining higher (e.g., 30-$m$) bits of the first subset of bits. The value of m can be, for example, 0, 1, 2, 4, or 6.

For example, if the first subset of bits obtained at block 404 is the subset $S_{34}S_{35} \ldots S_{63}$, and the value of m is 1, then the second bit sequence is generated at block 414 to include the second subset $S_{34}\overline{S}_{35}\overline{S}_{36}\overline{S}_{37} \ldots \overline{S}_{63}$. The value of the lowest bit of the second subset of bits is thus the same as the value of the lowest bit ($S_{34}$) of the first subset of bits, but the values of the higher bits of the second subset are the complements of the values of the corresponding higher bits $S_{35}S_{36} \ldots S_{63}$ of the first subset. The first 34 bits of the second bit sequence generated at block 414 are generated in the same manner (e.g., the values of the first m bits are the same as in the first bit sequence, and the values of the remaining (e.g., 34-$m$) bits are the complements of the bits in the first bit sequence), or alternatively generated in other manners (e.g., the same bit values as in the first bit sequence, generated randomly, and so forth). For example, the first 34 bits of the second bit sequence generated at block 414 can be $S_0S_1 \ldots S_{33}$, or $S_0\overline{S}_1\overline{S}_2\overline{S}_3 \ldots \overline{S}_{33}$, and so forth.

Alternatively, the second bit sequence is generated independent of, and is not based on, the first bit sequence obtained at block 404. For example, the second bit sequence obtained at block 412 can be a random or pseudo-random number.

The first subset of bits is a number of bits equal to the number of bits in the data obtained at block 402. In one or more embodiments, the first subset of bits is the higher bits of the first bit sequence, although alternatively the first subset of bits is the lower (or other selected) bits of the first bit sequence. In the example 600, a second sequence of bits is $S_0'S_1' \ldots S_{63}'$, and the second subset of the second sequence of bits is subset 604, which is a 30-bit sequence of the higher bits of the first bit sequence. Thus, the subset 604 is the 30-bit sequence $S_{34}'S_{35}' \ldots S_{63}'$.

At block 414, the data obtained at block 402 and the second subset of bits obtained at block 412 are combined to generate a second combined bit sequence. In one or more embodiments, the data and the second subset of bits are combined by applying an exclusive OR operation to the data and the second subset of bits. Alternatively, the data and the second subset of bits can be combined in different manners by applying different operations to the data and the second subset of bits. In the example 600, a second combined bit sequence 606 is illustrated as the 30-bit sequence $\tilde{x}\_0^{\wedge'} \tilde{x}\_1^{\wedge'} \ldots \tilde{x}\_29^{\wedge'}$.

At block 416, an error correcting code is applied to the second combined bit sequence to generate a second code word. The second code word has a length (number of bits) greater than the second combined bit sequence generated at block 414. The second code word includes both parity information (a set of parity bits) and the second combined bit sequence generated at block 414. In the example 600, the second code word 608 is illustrated as the combination of a set of parity bits 610 and the second combined bit sequence 606. The second code word 608 is the 64-bit sequence of $c_0'c_1' \ldots c_{33}'$ (the parity bits) followed by $\tilde{x}_0'\tilde{x}_1' \ldots \tilde{x}_{29}'$ (the second combined bit sequence).

In one or more embodiments, the error correcting code is the same error correcting code as discussed above at block 408. Alternatively, other error correcting codes can be used, analogous to the discussion above at block 408.

At block 418, the second code word generated at block 416 is combined with the second bit sequence obtained at block 412 to generate second encoded data. In one or more embodiments, the second code word and the second bit sequence are combined by applying an exclusive OR operation to second code word and the second bit sequence. Alternatively, the second code word and the second bit sequence can be combined in different manners by applying different operations to the second code word and the second bit sequence. The second encoded data includes parity information (a set of parity bits—the parity bits from the code word, modified based on the combination with the second bit sequence), and the originally obtained data (the data obtained at block 402).

In the example 600, the exclusive OR operation is applied to the second code word 608 and the second bit sequence 612, resulting in the second encoded data 614. The second encoded data 614 is illustrated as the combination of a set of parity bits 616 and the data 502. The second code word 608 is the 64-bit sequence of $\tilde{c}\_0^{\wedge'} \tilde{c}\_1^{\wedge'} \ldots \tilde{c}\_33^{\wedge'}$ (the parity bits combined with the first bit sequence) followed by $a\_0 a\_1 \ldots a\_29$ (the data).

It should be noted that, due to the second subset of bits at block 414 being different than the first subset of bits at block 406, the first code word and the second code word are different, resulting in the first encoded data and the second encoded data being different. However, this difference lies in the parity bits in the first encoded data and the second encoded data, not in the originally obtained data, as illustrated in examples 500 and 600.

The obtained data at block 402 can be transmitted to a target device as the second encoded data. The 64-bit sequence that is the second encoded data includes both parity information (the parity bits generated by the error correcting code combined with the second bit sequence) and the data obtained at block 402. The target device can use the parity information to identify and correct incorrect bit values in the obtained data using any of a variety of public and/or proprietary techniques.

Thus, with process 400, the obtained data can be transmitted using the first encoded data or the second encoded data. The source device can determine whether to transmit the first encoded data or the second encoded data based on various rules or criteria, such as detected or anticipated interference with other devices. As the first and second encoded data are based on the first and second code words, respectively, and the process 400 expands the number of code words that are available, the amount of unique encoded data that can be transmitted is increased (e.g., doubled).

In one or more embodiments, the obtained data is a 30-bit value that is the Bluetooth® address of the source device and the 6-bit Barker sequence as discussed above. In such embodiments, the second encoded data is a 64-bit Bluetooth® synchronization word that is included in an access code transmitted to a target device.

The combination of the first subset of bits and the obtained data at block 406 can be viewed as shifting the obtained data in a direction indicated by a vector that is the first subset of bits. Accordingly, in one or more embodiments in order to increase a distance between code words generated at block 408 and code words generated at block 416, the second bit sequence is generated at block 412 so that the second subset of bits shifts the obtained data in a direction approximately opposite of the direction indicated by a vector that is the first subset of bits. Shifting the obtained data in this approximately opposite direction is obtained, for example, by having the values of the lower m bits of the second subset of bits be equal to the values of the corresponding lower m bits of the first subset of bits, and having the values of the remaining higher 30-$m$ bits of the second subset of bits be equal to the complements of the values of the corresponding remaining higher 30-$m$ bits of the first subset of bits.

Shifting the obtained data in approximately the opposite direction indicated by a vector that is the first subset of bits results in little, if any, decrease in the error correction performance. For example, as a result of the error correcting code applied at block 408, the Hamming distance between different resultant first encoded data at block 410 due to different obtained data can be 14. Similarly, as a result of the error correcting code applied at block 416, the Hamming distance between different resultant second encoded data at block 418 due to different obtained data can be 14. Further, the Hamming distance between different resultant first encoded data at block 410 and resultant second encoded data at block 418 can be 13. Thus, a small reduction in error correcting ability may result (e.g., due to the Hamming distance dropping from 14 to 13), but double the number of code words can be generated.

Thus, as can be seen from process 400, by combining the data with a second subset of bits, an additional set of code words can be obtained by applying the error correcting code twice (once for each subset of bits). The size (number of bits) of the data remains the same, so the number of generated code words is increased without any changes to the size of the data, and with little if any decrease in the error correction performance. Increasing the number of code words that can be generated supports various different usage scenarios. For example, by increasing the number of code words that can be generated, the number of Bluetooth® synchronization words that can be generated is increased.

Figure 7A:
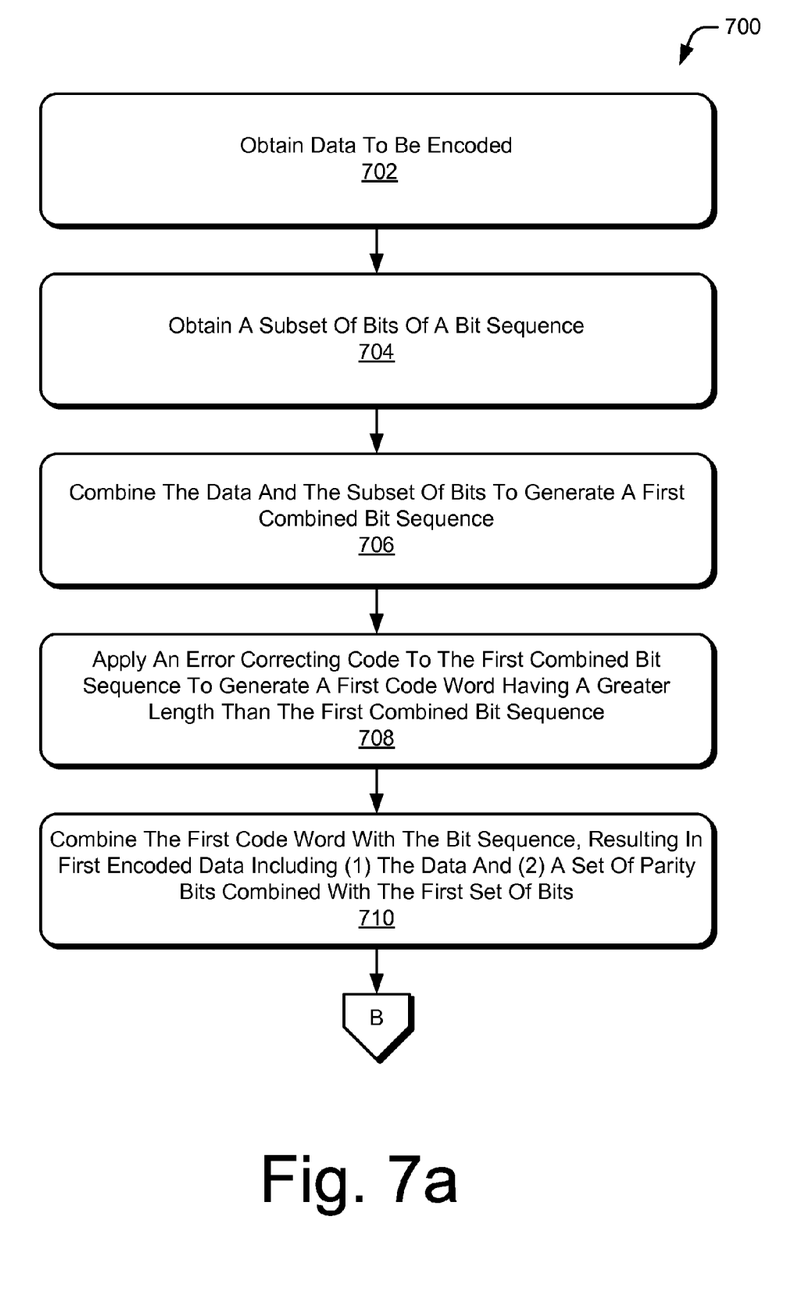
FIGS. 7a and 7b are a flowchart illustrating another example process for generating expanded code words to support error correction in a data communication system in accordance with one or more embodiments.
Figure 7B:
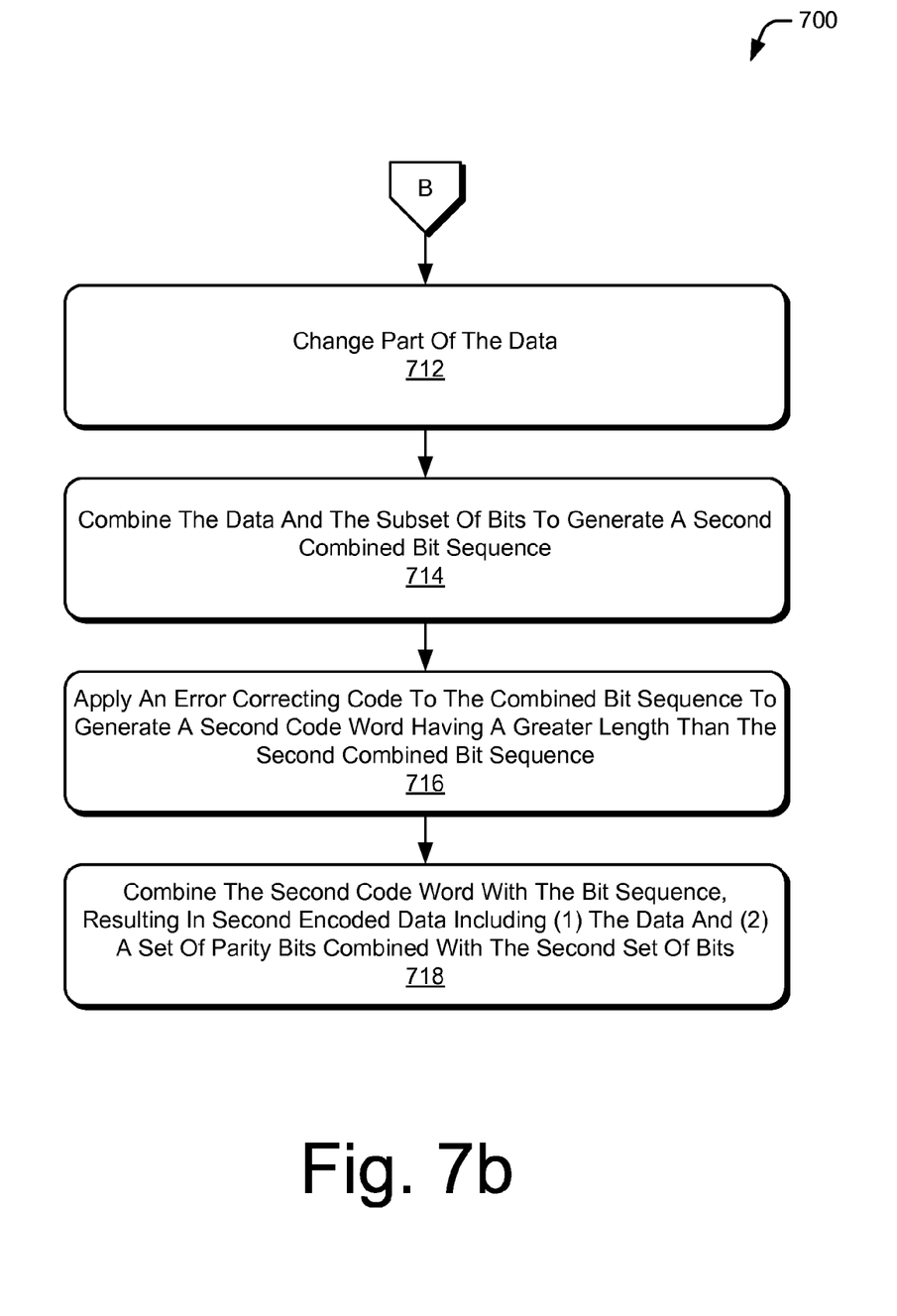

FIGS. 7a and 7b are a flowchart illustrating an example process 700 for generating expanded code words to support error correction in a data communication system in accordance with one or more embodiments. Process 700 is described in the form of a set of blocks that specify operations to be performed, and the operations are not necessarily limited to the order shown. The operations performed by the set of blocks in process 700 are performed by an expanded code word data encoder, such as the expanded code word data encoder 110 of FIG. 1, the expanded code word data encoder 218 of FIG. 2, or the expanded code word data encoder 314 of FIG. 3.

The process 700 of FIGS. 7a and 7b is similar to the process 400 of FIGS. 4a and 4b. However, process 700 differs from process 400 in that rather than using a first bit sequence and a second bit sequence while leaving the data unchanged as discussed in process 400, in process 700, the data is changed while leaving the bit sequence unchanged.

At block 702, data to be encoded is obtained. The data can be obtained in any of a variety of different manners, as discussed above at block 402. In one or more embodiments, the obtained data is at least part of a Bluetooth® address of the source device, such as a 24-bit Lower Address Part (LAP), and a 6-bit Barker sequence (which is 110010 or 001101). This 6-bit Barker sequence is changed during process 700 to increase the number of code words that are obtained.

At block 704, a subset of bits of a bit sequence is obtained. The expanded code word data encoder obtains the bit sequence by generating the bit sequence, or alternatively obtains the sequence of bits from another component or module. The bit sequence can be obtained in various manners, as discussed above at block 404.

At block 706, the data obtained at block 702 and the subset of bits obtained at block 704 are combined to generate a first combined bit sequence. In one or more embodiments, the data and bits are combined by applying an exclusive OR operation to the data and the subset of bits, although other operations can alternatively be used, as discussed above at block 406.

At block 708, an error correcting code is applied to the first combined bit sequence to generate a first code word, as discussed above at block 408. The first code word has a length (number of bits) greater than the first combined bit sequence generated at block 706, and can be a BCH error correcting code.

At block 710, the first code word generated at block 708 is combined with the bit sequence obtained at block 704 to generate first encoded data. In one or more embodiments, the first code word and the first bit sequence are combined by applying an exclusive OR operation to the first code word and the first bit sequence, although other operations can alternatively be used, as discussed above at block 410.

At block 712, part of the data is changed. In one or more embodiments, the obtained data is at least part of a Bluetooth® address of the source device that includes a 24-bit Lower Address Part (LAP) and a 6-bit Barker sequence (110010 or 001101). At block 712, the data is changed so that this 6-bit Barker sequence remains a 6-bit Barker sequence, but is different than the 6-bit Barker sequence in the data obtained at block 702. For example, if the 6-bit Barker sequence 110010 is used at block 702, then the 6-bit Barker sequence 001101 is used at block 712.

At block 714, the data obtained at block 712 and the subset of bits obtained at block 704 are combined to generate a second combined bit sequence. This combining is analogous to the combining discussed above at block 706, although the data is the data obtained at block 712 rather than the data obtained at block 702.

At block 716, an error correcting code is applied to the second combined bit sequence to generate a second code word. The second combined bit sequence is generated analogous to the generation of the first combined bit sequence discussed above at block 708, although the second combined bit sequence is based on the second code word rather than the first code word. In one or more embodiments, the error correcting code is the same error correcting code as discussed above at block 708. Alternatively, other error correcting codes can be used, analogous to the discussion above at block 408.

At block 718, the second code word generated at block 716 is combined with the second bit sequence obtained at block 712 to generate second encoded data. The second encoded data is generated analogous to generation of the first encoded data discussed above at block 710, although the second encoded data is based on the second code word rather than the first code word.

The obtained data at block 702 can be transmitted to a target device as the first encoded data generated at block 710 and the second encoded data generated at block 718, analogous to the first and second encoded data of process 400 of FIG. 4.

Process 700 is discussed with reference to the data including a 24-bit Lower Address Part (LAP) and a 6-bit Barker sequence (110010 or 001101). It should be noted, however, that process 700 can analogously be applied to other data that includes a variable portion (e.g., analogous to the 24-bit LAP) and a static portion (e.g., analogous to the 6-bit Barker sequence, a portion that can be switched between multiple values without changing the meaning of the information include in the 30 bits of data).

The discussions herein include references to using an error correcting code that results in a 64-bit output value given a 30-bit input value. Such an error correcting code or encoder is also referred to as a 64,30 error correcting code or a (64,30) encoder. It should be noted that the values of 64 bits and 30 bits are examples, and that error correcting codes or encoders that take input values of more or less than 30 bits can be used, and that error correcting codes or encoders that output values of more or less than 64 bits can be used. However, it should also be noted that the error correction performance of the error correcting codes or encoders may decrease as the number of bits in the output value becomes closer to the number of bits in the input value.

In some embodiments the data obtained at block 402 (or alternatively obtained at block 702) is alternatively a sequence of symbols instead of bits. In such embodiments the first bit sequence may become a first symbol sequence and subsequent operations in the process 400 (or alternatively the process 700) are performed on symbols. An error correcting code operating directly on symbols such as elements of a finite field may be used. For example, a collection of bits (such as a byte) forms a valid symbol which can be directly encoded by an error correcting code such as a linear block code or a convolutional code.

Figure 8:
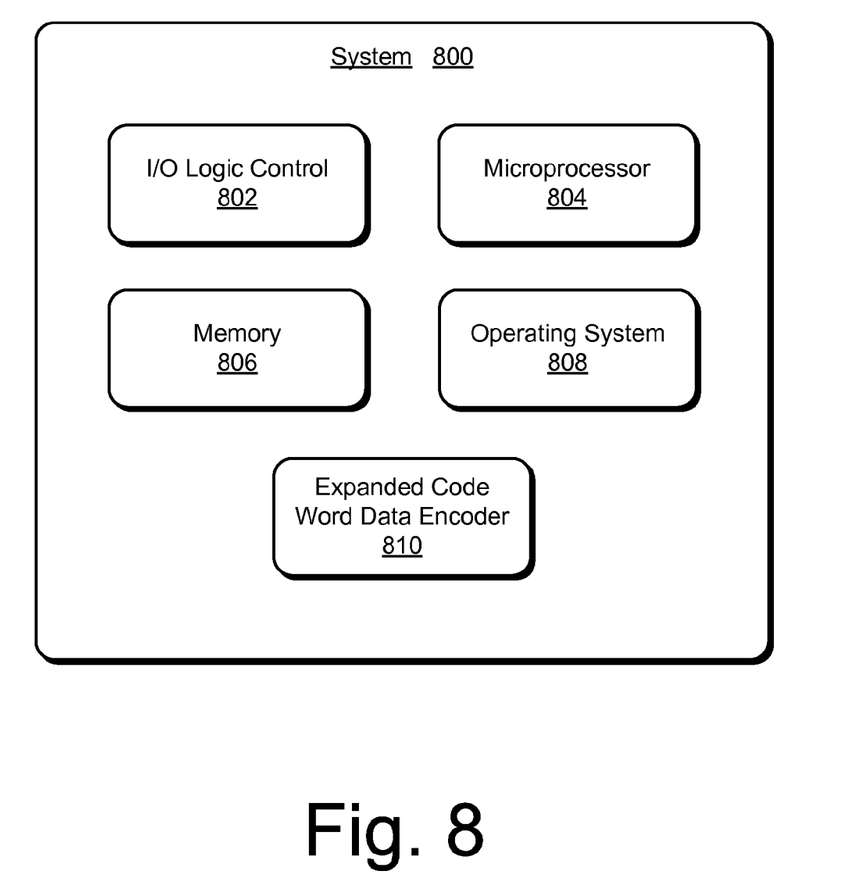
FIG. 8 illustrates an example system that can implement various aspects of the techniques described herein

FIG. 8 illustrates an example system 800 that can implement various aspects of the techniques described herein. System 800 can be implemented in a variety of different devices, such as one or a combination of a media device, computer device, television set-top box, video processing and/or rendering device, Ethernet interface, switch, appliance device, gaming device, electronic device, vehicle, workstation, smart phone, tablet, and/or in any other type of computing device. System 800 can be implemented as a System-on-Chip (SoC).

System 800 can include electronic circuitry, a microprocessor, memory, input-output (I/O) logic control, communication interfaces and components, other hardware, firmware, and/or software needed to run a device. System 800 can also include an integrated data bus (not shown) that couples the various components of the system for data communication between the components. A wireless communication device that includes system 800 can also be implemented with many combinations of differing components.

In this example, system 800 includes various components such as an input-output (I/O) logic control 802 (e.g., to include electronic circuitry) and a microprocessor 804 (e.g., any of a microcontroller or digital signal processor). System 800 also includes a memory 806, which can be any type and/or combination of RAM, low-latency nonvolatile memory (e.g., Flash memory), ROM, one-time programmable memory, and/or other suitable electronic data storage. Alternately or additionally, system 800 may comprise a memory interface for accessing additional or expandable off-chip memory, such as an external Flash memory module. System 800 can also include various firmware and/or software, such as an operating system 808, which can be computer-executable instructions maintained by memory 806 and executed by microprocessor 804. System 800 may also include other various communication interfaces and components, communication components, other hardware, firmware, and/or software, and so forth.

System 800 also includes an expanded code word data encoder 810 that generates encoded data as discussed herein. The expanded code word data encoder 810 can be, for example, the expanded code word data encoder 110 of FIG. 1, the expanded code word data encoder 218 of FIG. 2, or the expanded code word data encoder 314 of FIG. 3. The expanded code word data encoder can be implemented in hardware, firmware, software, or combinations thereof.

One or more of the methods or techniques described above can take the form of a computer program product accessible from a computer-usable or computer-readable medium providing program code for use by or in connection with a computer or any instruction execution system. For the purposes of this description, a computer-usable or computer-readable medium can be any apparatus that can tangibly store the program for use by or in connection with the instruction execution system, apparatus, or device. The medium can be an electronic, magnetic, optical, electromagnetic, infrared, or semiconductor system (or apparatus or device). Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. However, computer-readable medium exclude signals, signal transmission, and carrier waves.

Although the subject matter has been described in language specific to structural features and/or methodological operations, it is to be understood that the subject matter defined in the appended claims is not necessarily limited to the specific features or operations described above, including orders in which they are performed.

What is claimed is:

1. A method comprising:
    obtaining data to be encoded;
    obtaining a first subset of bits of a first bit sequence;
    combining the data and the first subset of bits to generate a first combined bit sequence;
    applying an error correcting code to the first combined bit sequence to generate a first code word having a greater length than the first combined bit sequence;
    combining the first code word with the first bit sequence, resulting in first encoded data that includes both first parity information and the data; and
    repeating the applying and each combining with a second subset of bits of a second bit sequence, the second subset of bits being derived from the first subset of bits by:
        including a lowest single bit that has a same value as a lowest single bit of the first subset of bits; and
        including remaining higher bits each having a value that is the complement of a corresponding bit in the first subset of bits,
    the repeating resulting in second encoded data that includes both second parity information and the data, the second encoded data being based on a second code word generated by the error correcting code rather than the first code word.

2. The method of claim 1, wherein the repeating comprises:
    obtaining the second subset of bits;
    combining the data and the second subset of bits to generate a second combined bit sequence;

applying the error correcting code to the second combined bit sequence to generate the second code word having a greater length than the second combined bit sequence; and combining the second code word with the second bit sequence, resulting in the second encoded data that includes both the second parity information and the data.

3. The method of claim 1, wherein the second subset of bits includes:
a lowest particular number of multiple bits that have a same value as a corresponding lowest particular number of multiple bits of the first subset of bits; and
remaining higher bits each having a value that is the complement of corresponding bits in the first subset of bits.

4. The method of claim 1, wherein the first bit sequence comprises a pseudo-randomly generated number.

5. The method of claim 4, wherein the second bit sequence comprises an additional pseudo-randomly generated number.

6. The method of claim 1, wherein the first encoded data comprises a first wireless communication synchronization word, and the second encoded data comprises a second wireless communication synchronization word.

7. The method of claim 1, wherein the each combining comprises applying an exclusive OR operation.

8. The method of claim 1, wherein the error correcting code is a BCH error correcting code.

9. The method of claim 1, the obtained data to be encoded comprising a 24-bit Lower Address Part and a 6-bit Barker sequence.

10. A device comprising:
a hardware expanded code word data encoder configured to
obtain data to be encoded,
obtain a first subset of bits of a first bit sequence,
combine the data and the first subset of bits to generate a first combined bit sequence,
apply an error correcting code to the first combined bit sequence to generate a first code word having a greater length than the first combined bit sequence,
combine the first code word with the first bit sequence, resulting in first encoded data that includes both first parity information and the data, and
repeat the applying and each combining with a second subset of bits of a second bit sequence, the second subset of bits being derived from the first subset of bits by:
including a lowest single bit that has a same value as a lowest single bit of the first subset of bits; and
including remaining higher bits each having a value that is a complement of the corresponding bit in the first subset of bits,
the repetition resulting in second encoded data that includes both second parity information and the data, the second encoded data being based on a second code word generated by the error correcting code rather than the first code word, and
a transmitter configured to transmit the first encoded data and the second encoded data to one or more target devices.

11. The device of claim 10, wherein the second subset of bits includes:

a lowest particular number of multiple bits that have a same value as a corresponding lowest particular number of multiple bits of the first subset of bits; and
remaining higher bits each having a value that is the complement of corresponding bits in the first subset of bits.

12. The device of claim 10, wherein the first encoded data comprises a first wireless communication synchronization word, and the second encoded data comprises a second wireless communication synchronization word.

13. The device of claim 10, wherein the hardware expanded code word data encoder is configured to combine by applying an exclusive OR operation.

14. The device of claim 10, wherein the error correcting code is a BCH error correcting code.

15. The device of claim 10, wherein the obtained data to be encoded comprises a 24-bit Lower Address Part and a 6-bit Barker sequence.

16. A non-transitory computer-readable medium comprising computer-executable instructions that, when executed, implement a system to:
obtain data to be encoded;
obtain a first subset of bits of a first bit sequence;
combine the data and the first subset of bits to generate a first combined bit sequence;
apply an error correcting code to the first combined bit sequence to generate a first code word having a greater length than the first combined bit sequence;
combine the first code word with the first bit sequence, resulting in first encoded data that includes both first parity information and the data; and
repeat the applying and each combining with a second subset of bits of a second bit sequence, the second subset of bits being derived from the first subset of bits by:
including a lowest single bit that has a same value as a lowest single bit of the first subset of bits; and
including remaining higher bits each having a value that is the complement of a corresponding bit in the first subset of bits,
the repetition resulting in second encoded data that includes both second parity information and the data, the second encoded data being based on a second code word generated by the error correcting code rather than the first code word.

17. The non-transitory computer-readable medium of claim 16, wherein the second subset of bits includes:
a lowest particular number of multiple bits that have a same value as a corresponding lowest particular number of multiple bits of the first subset of bits; and
remaining higher bits each having a value that is the complement of corresponding bits in the first subset of bits.

18. The non-transitory computer-readable medium of claim 16, wherein the computer-executable instructions, when executed, combine by applying an exclusive OR operation.

19. The non-transitory computer-readable medium of claim 16, wherein the error correcting code is a BCH error correcting code.

20. The non-transitory computer-readable medium of claim 16, wherein the obtained data to be encoded comprises a 24-bit Lower Address Part and a 6-bit Barker sequence.

* * * * *